United States Patent
Pakr et al.

(10) Patent No.: US 7,170,044 B2
(45) Date of Patent: Jan. 30, 2007

(54) SEMICONDUCTOR PHOTODETECTOR FOR DETECTING LIGHT HAVING A WAVELENGTH IN THE ULTRAVIOLET BLUE RANGES

(75) Inventors: Kun Sik Pakr, Daejon-Shi (KR); Seong Wook Yoo, Daejon-Shi (KR); Jong Moon Park, Daejon-Shi (KR); Yong Sun Yoon, Daejon-Shi (KR); Sang Gi Kim, Daejon-Shi (KR); Bo Woo Kim, Daejon-shi (KR); Yoon Kyu Bae, Daejon-Shi (KR); Byung Won Lim, Daejon-Shi (KR); Jin Gun Koo, Daejon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 0 days.

(21) Appl. No.: 10/913,398

(22) Filed: Aug. 9, 2004

(65) Prior Publication Data

US 2005/0139753 A1    Jun. 30, 2005

(30) Foreign Application Priority Data

Dec. 26, 2003    (KR) ................ 10-2003-0097048

(51) Int. Cl.
*H01J 40/14* (2006.01)
(52) U.S. Cl. .................... 250/214.1; 257/431
(58) Field of Classification Search ............. 250/214.1, 250/226; 257/225, 257, 290, 437, 431–432
See application file for complete search history.

(56) References Cited

U.S. PATENT DOCUMENTS

| | | | | |
|---|---|---|---|---|
| 4,282,541 A | * | 8/1981 | Tsang | .......................... 257/458 |
| 4,360,564 A | * | 11/1982 | Philipp | ........................ 428/336 |
| 4,433,343 A | * | 2/1984 | Levine | ........................ 257/290 |
| 4,720,746 A | * | 1/1988 | Moore | ........................ 348/315 |
| 4,910,570 A | | 3/1990 | Popovic | |
| 4,990,990 A | * | 2/1991 | Albrecht et al. | ............. 257/290 |
| 5,394,005 A | | 2/1995 | Brown et al. | |
| 6,081,020 A | * | 6/2000 | Frahm et al. | ................ 257/458 |
| 6,888,214 B2 | * | 5/2005 | Mouli et al. | ................ 257/510 |

FOREIGN PATENT DOCUMENTS

JP    03-136282    6/1991

OTHER PUBLICATIONS

Dankovic et al., "Analysis of Radiation Absorptance in Silicon Ultraviolet Detector", IEEE, May 2000, pp. 585-588.
Lerch et al., "Spectral Characterization of a Blue-Enhanced Silicon Photodetector", IEEE, Aug. 2001, pp. 1220-1224.
Mullins et al., "A Simply High-Speed Si Schottky Photodiode", IEEE, Apr. 1991, pp. 360-362.

* cited by examiner

*Primary Examiner*—Stephone B. Allen
*Assistant Examiner*—Patrick J. Lee
(74) *Attorney, Agent, or Firm*—Mayer Brown Rowe & Maw LLP

(57) ABSTRACT

Provided is a photodetector in which a transparent nonconductive material having an interface charge and a trapped charge is deposited on a semiconductor surface so as to form a depletion region on the surface of the semiconductor, and the depletion region is employed as an optical detecting region, thereby not only improving detection with respect to light having a wavelength of ultraviolet and blue ranges but also filtering light having a wavelength of visible and infrared ranges, and in which a fabricating process thereof is compatible with a universal silicon CMOS process.

12 Claims, 4 Drawing Sheets

SEMICONDUCTOR PHOTODETECTOR FOR DETECTING LIGHT HAVING A WAVELENGTH IN THE ULTRAVIOLET BLUE RANGES

BACKGROUND

1. Field of the Invention

The present invention relates to a semiconductor photodetector, and more particularly, to a photodetector which is useful in detecting light having a wavelength of ultraviolet and blue ranges.

2. Description of the Related Art

In a photodetector as a semiconductor device, an ultraviolet detector is being widely used in military, environmental, and industrial fields, for example a flame monitor, a water purification system, money counting and fake detection machines, a sunlight exposure meter, photochemical phenomena detection, etc.

As the most widely used material for a semiconductor, silicon has an energy gap of 1.1 eV and reacts to visible light, so that it is difficult to selectively detect only light having a wavelength of an ultraviolet range. Further, as a representative photodetector, a PN or PIN junction diode absorbs most of the light of short wave length in the vicinity of a surface thereof, so that the created carriers are recombined and do not substantially contribute to the electrical signal. For this reason, the ultraviolet detector mainly includes a material such as gallium nitride (GaN), silicon carbide (SiC), etc., which has a relatively large energy gap, and is generally made into a schottky diode to reduce a loss due to the recombination.

Generally, the semiconductor photodetector is made in forms of a PN junction diode, a PIN junction diode, a schottky diode, a metal oxide semiconductor (MOS) capacitor, etc., wherein a depletion region of the semiconductor is employed as a light detection region of the photodetector.

In the conventional photodetector using the PIN diode, a substrate having an N− intrinsic layer grown thereon by an epitaxial process is used. On the substrate are formed a P+ diffusion region and a P guardring region by an ion implantation process. Then, a dielectric layer is formed, and the light entrance window is opened. That is, the light entrance window includes the P+ diffusion region.

The foregoing PIN diode fabricated using a silicon wafer as described above is effective in detecting visible light or near infrared. However, the PIN diode has a limit to detect the light having a wavelength of ultraviolet and blue ranges because most of the light is absorbed at the surface of the semiconductor, and generated carriers are recombine. Further, the PIN diode is inadequate to be employed as the photodetector for selectively detecting the ultraviolet light.

On the other hand, if a semiconductor material such as silicon carbide (SiC), gallium nitride (GaN), etc. is used instead of silicon, it is possible to filter relatively long wavelength light such as visible light, infrared light, etc., but there is a loss due to absorption and recombination at the surface of the semiconductor. In the case of silicon carbide (SiC), manufacturing process has to be performed separately from a universal silicon process because of carbon contamination, and is incompatible with the silicon CMOS process. In the case of a compound semiconductor such as gallium nitride (GaN), etc., the wafer is expensive and the process is complicated.

Meanwhile, the schottky diode made of the silicon wafer allows the photodetector to be improved in detecting the light having the wavelength of the ultraviolet range, but causes the light to be reflected from and absorbed in a schottky contact metal thereof. Likewise, a schottky diode process is incompatible with the silicon CMOS process. Further, in the case of the schottky diode using the compound semiconductor such as GaN, SiC, etc., the wafer is expensive and the process is complicated.

SUMMARY OF THE INVENTION

The present invention is directed to a photodetector which is improved in detecting light having a wavelength of ultraviolet and blue ranges, and is capable of filtering light having a wavelength of visible and infrared ranges.

Further, the present invention is directed to a photodetector of which silicon may be used and a fabricating process is compatible with a universal silicon CMOS process.

One aspect of the present invention is to provide a photodetector comprising: a semiconductor substrate in which a light entrance window is defined for detecting light; a transparent nonconductive layer having a charge and formed on the light entrance window formed on a top of the semiconductor substrate; and at least one electrode for transferring the charge detected in the light entrance window; wherein the light entrance window has a depletion region on a semiconductor surface thereof depleted by the charge of the transparent nonconductive layer.

Preferably, the charge of the transparent nonconductive material is classified into an ionic charge, a trapped charge, a fixed charge, an interface charge, etc., and can be artificially added by an ion implantation process, a plasma process, etc.

According to an aspect of the invention, the transparent nonconductive layer has a thickness adequate to a wavelength of incident light to function as an anti-reflecting layer.

According to an aspect of the invention, the at least one electrode is composed of a first electrode of a first highly doped diffusion region formed at one end of the depleted surface of the semiconductor substrate; and a second electrode of a second highly doped diffusion region formed at the other end of the depleted surface of the semiconductor substrate, or the at least one electrode is composed of a first electrode of a first (concentration type opposite to that of the semiconductor substrate) highly doped diffusion region formed at opposite ends of the depleted surface of the semiconductor substrate; and a second electrode of a second (opposite to the first-type) highly doped diffusion region formed on a back side of the semiconductor substrate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are provided so that this disclosure will be thorough and complete, and will fully convey the scope of the invention to those skilled in the art.

(First Embodiment)

Figure 1A:
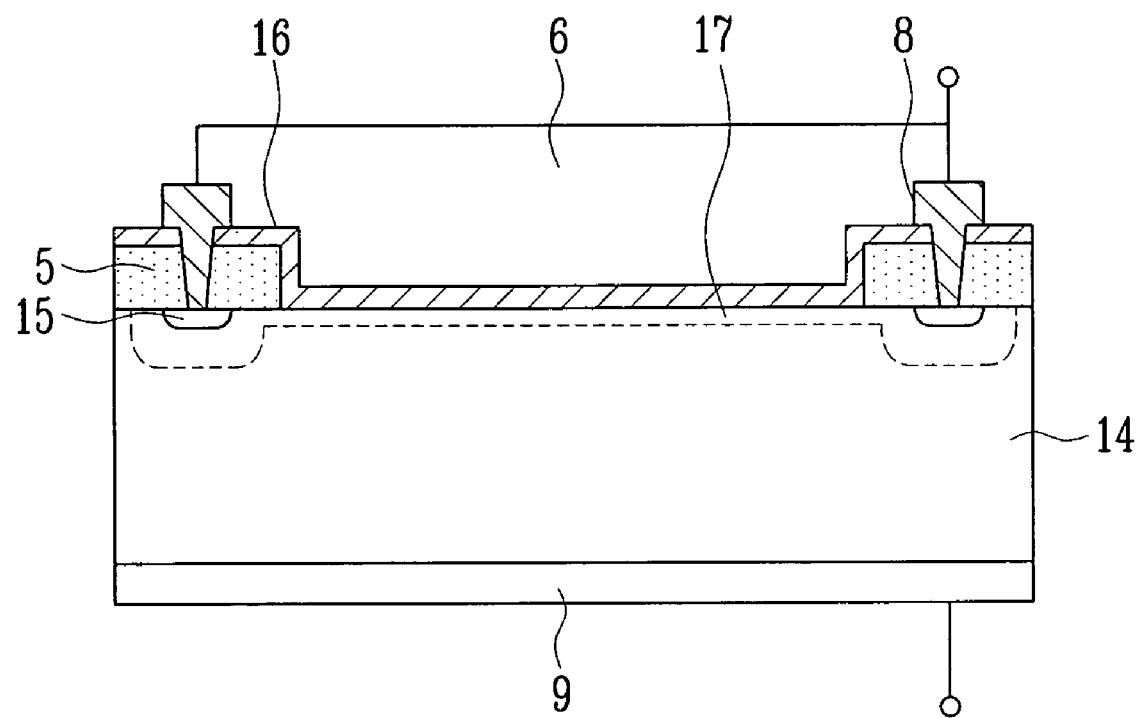
FIG. 1A is a cross sectional view of a photodetector according to a first embodiment of the present invention.

Hereinbelow, a photodetector according to a first embodiment of the present invention will be described with reference to FIG. 1A. FIG. 1A is a cross sectional view of the photodetector according to the first embodiment of the present invention.

An N+ or P+ diffusion region 15 is formed at opposite ends of a light entrance window 6 on a semiconductor substrate 14 by an ion implantation method or the like. The semiconductor substrate 14 may be either a P-type or an N-type. In this embodiment, the P-type semiconductor substrate 14 is exemplarily illustrated. Here, the N+ diffusion region 15 is by way of example doped at a doping concentration of about $10^{18}/cm^3$ or more. Alternatively, in the case of an N-type semiconductor substrate, the P+ diffusion region 15 may be by way of example doped at a doping concentration of about $10^{18}/cm^3$ or more.

On the N+ diffusion region is formed a dielectric layer 5 to a thickness of 1,000 Å through 10,000 Å, and then the light entrance window 6 is opened thereon by photolithography and etching processes. Then, on the dielectric layer 5a is deposited a transparent nonconductive material 16 which has an interface charge or a trapped charge. Any material can be used as the nonconductive material 16 as long as it is nonconductive and transparent. For example, the nonconductive material 16 may be a silicon oxide ($SiO_x$) layer or a silicon nitride ($SiN_x$) layer. The transparent nonconductive material 16 may be configured to have a thickness adequate to a wavelength of incident light, thereby functioning as an anti-reflector of the photodetector.

For example, when the transparent nonconductive material 16 has a refraction index of n and the incident light has a wavelength of λ, the thickness of the transparent nonconductive material 16 to be used as an anti-reflection layer is determined as the following equation (1).

$$d=\lambda/4n*m \quad (1)$$

(where m is 1, 3, 5 . . . )

Thus, in the case that the silicon nitride layer (n=2.05) is employed as the transparent nonconductive material 16 and the incident light has a wavelength of 900 nm, the preferable thickness d of the transparent nonconductive material 16 is about 1,100 Å.

Further, the transparent nonconductive material 16 formed on the semiconductor substrate 14 includes the interface charge or the trapped charge. Such charges deplete a surface of the semiconductor substrate 14, so that the depletion region can be used as an optical detecting region. For example, in the case that the silicon oxide layer is employed as the transparent nonconductive material 16, the transparent nonconductive material 16 includes an ionic charge, a trapped charge, a fixed charge, an interface charge, etc. As a representative example of the ion charge, there is a contaminant such as Na+ or the like. The trapped charge is due to an electron or a hole trapped in a bulky dielectric layer, for example, in the case of an oxide compound or a nitride compound, $SiO_2$ or $Si_3N_4$ has a defective or faulty lattice in itself, thereby including the trapped charge. The defective or faulty lattice is likely to be generated during a universal semiconductor fabricating process such as an ion implantation process, an electron beam evaporation process, a reactive-ion etching process, etc. In the case of the interface charge, a set of interface charges (positive charge) are generated from the interface of Si—SiO2 in an interface state. Such interface charge is originated from sudden discontinuance of a crystal lattice of the semiconductor on the surface of the oxide, wherein charge density thereof varies according to a forming method of the oxide layer. In the case of a silicon oxide layer formed by thermal oxidation, the charge density is about $\sim 3\times 10^{10}/cm^2$. In the case of an oxide layer formed by other chemical vapor deposition (CVD) processes or a silicon nitride layer, the charge density is high, for example, it may have hole trap sites of about $\sim 10^{14}/cm^2$ or more. Further, the fixed charge is due to excess ionic silicon generated during a transition from Si to $SiO_2$. The fixed charge varies according to crystal directions, and, in the case of silicon with (100) plane. it has a value of at least $1.1\times 10^{10}/cm^2$ or more. Thus, the surface of the semiconductor may be depleted by the dielectric layer having the interface charge and the trapped charge, wherein the thickness of a depletion layer varies depending on the concentrations of the semiconductor substrate. For example, when the dielectric layer having a charge density of $5\times 10^{10}/cm^2$ is deposited on the silicon layer having a doping concentration of $10^{15}/cm^3$, the surface of the semiconductor is depleted by ~0.5 μm.

On the other hand, the charge can be artificially trapped in the transparent non conductive material 16 by a plasma process or the like. At this time, the surface of the semiconductor is depleted by the interface charge or the trapped charge. As described above, the trapped charge is likely to be generated during a universal semiconductor fabricating process such as the ion implantation process, the electron-beam evaporation process, the reactive-ion etching process, etc., wherein the quantity of the trapped charge can be adjusted by changing a plasma condition. In the universal semiconductor fabricating process, plasma such as $O^+$, $O_2^+$, $N^+$, $F^{3O}$, $CF_3^+$, etc. is mainly used, Herein, the ionic plasma is injected into the dielectric layer, thereby remaining ionized, combining with the electron to make a trapped hole at the position where the electron occupies, and allowing the dielectric layer to have the defective lattice corresponding to the charge.

To form an electrode, a contact is formed by the photolithography and etching processes, thereby forming a top metal interconnection line 8. Preferably, the top metal interconnection line 8 is made of aluminum, copper, etc. Also, the top metal interconnection line 8 is formed by a well-known process such as a sputtering process so as to have a thickness of 1,000 Å through 20,000 Å, and preferably a thickness of 8,000 Å.

Further, a bottom electrode which is made of aluminum, copper, etc. is formed on a back side of the semiconductor substrate 14 by a well-known process such as the sputtering process so as to have a thickness of 1,000 Å through 20,000 Å, thereby completing the photodetector.

As described above, the present photodetector is improved in detecting light having a wavelength of ultraviolet and blue ranges. That is, the transparent nonconductive material having the interface charge or the trapped charge is deposited on the semiconductor, thereby depleting the surface of the semiconductor. In the photodetector according to the present invention, the depletion region is employed as the optical detecting region, thereby improving the detection with respect to the incident light that has the wavelength of the ultraviolet and blue ranges and is mostly absorbed in the surface of the semiconductor, and filtering the light having the wavelength of the visible and infrared ranges. Further, the photodetector can use silicon, and the fabricating process thereof is compatible with the universal silicon CMOS process.

(Second Embodiment)

Figure 1B:
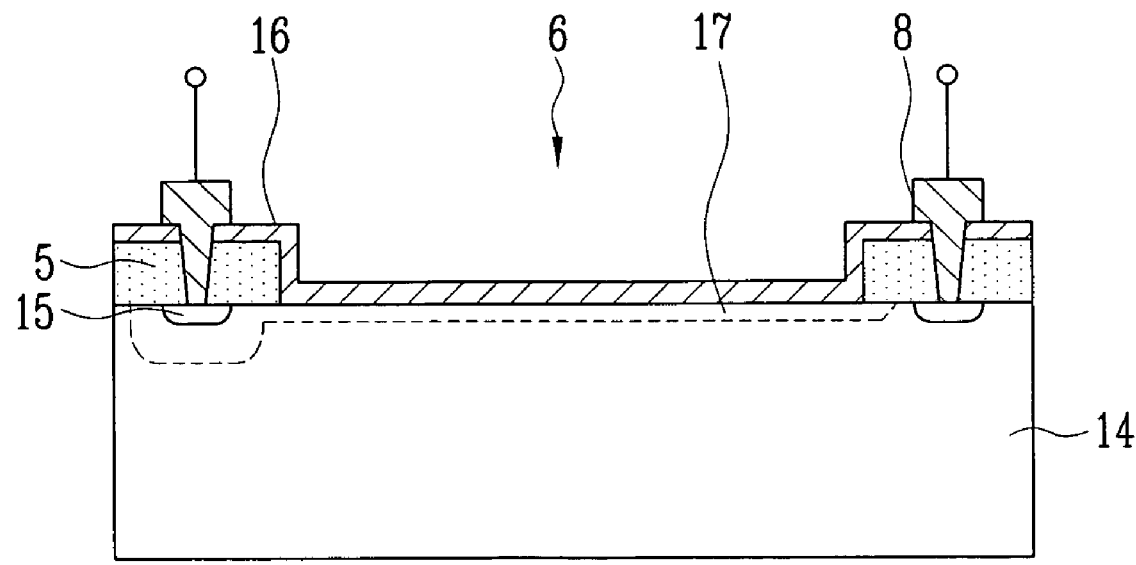
FIG. 1B is a cross sectional view of a photodetector according to a second embodiment of the present invention.

Hereinafter, a photodetector according to a second embodiment of the present invention will be described with reference to FIG. 1B. FIG. 1B is a cross sectional view of the photodetector according to the second embodiment of the present invention. In the following description, a difference between the first and second embodiments will be described and repetitive descriptions will be avoided.

In the second embodiment, an N+ diffusion region 15 is formed at one end of a depletion region, and a P+ diffusion region 18 is formed at the other end of the depletion region, so that its fabricating process is compatible with a universal semiconductor process, thereby allowing the photodetector according to the present invention to be integrated with other semiconductor devices such as a transistor into one chip. At this time, there is not needed a process of forming a metal interconnection line on a back side of a semiconductor substrate 14.

The P+ diffusion region 18 or the N+ diffusion region 15 is by way of example doped at a doping concentration of about $10^{18}/cm^3$ or more.

(Third Embodiment)

Figure 1C:
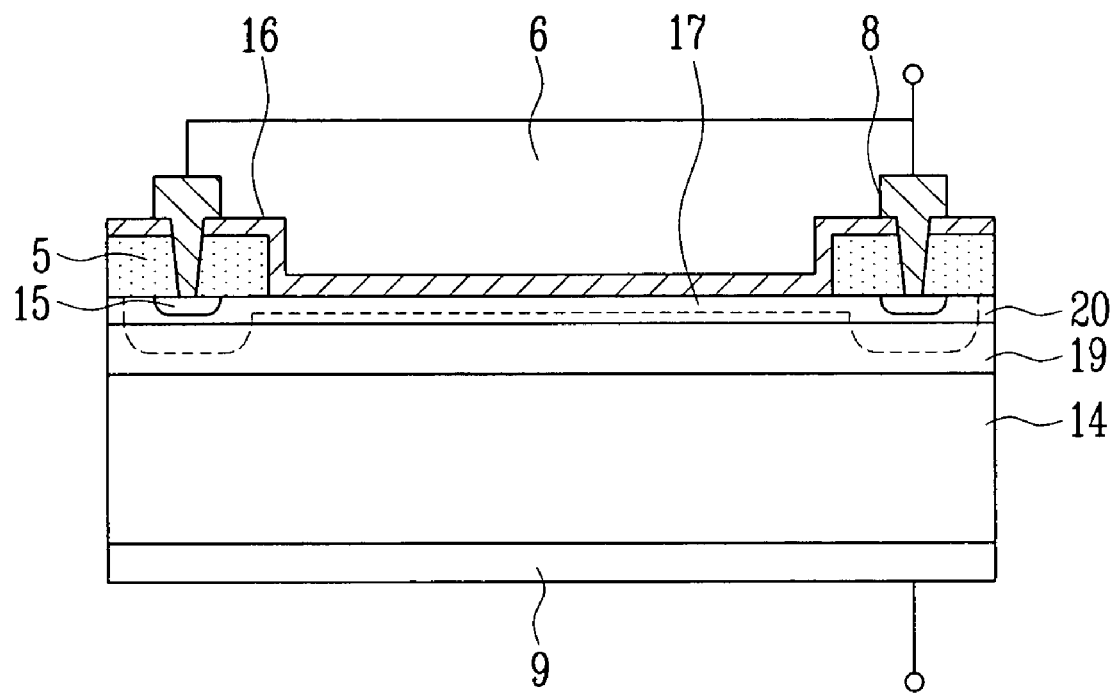
FIG. 1C is a cross sectional view of a photodetector according to a third embodiment of the present invention.

Hereinafter, a photodetector according to a third embodiment of the present invention will be described with reference to FIG. 1C. FIG. 1C is a cross sectional view of the photodetector according to the third embodiment of the present invention. In the following description, a difference between the first and third embodiments will be described and repetitive descriptions will be avoided.

In the third embodiment, a P-type (or N-type) semiconductor substrate 14, a highly doped P+ (or N+) doping layer 19, a lightly doped P+ (or N+) doping layer 20 are laminated in sequence. The semiconductor substrate 14 may be either a P-type or an N-type. In this embodiment, the P-type semiconductor substrate 14 is exemplarily illustrated.

The foregoing triple structure may be formed by an epitaxial growth process, or by an ion implantation process which is applied to the P-type semiconductor substrate 14 with hundreds of keV or more energy so as to form the embedded highly-doped P+ doping layer 19 and the superficial lightly-doped P+ doping layer 20. In the case of the P-type semiconductor substrate 14, boron (B) is preferably injected thereto. In the case of the N-type semiconductor substrate 14, phosphorous (P) is preferably injected thereto. On the other hand, the P-type semiconductor substrate 14 may be the same layer as the highly doped P+ doping layer 19, that is, the P-type semiconductor substrate 14 has a double structure that the lightly doped P+ doping layer 20 is formed on a P+ substrate. In this case, the high doping concentration is about $10^{17}/cm^3$ or more, and the light doping concentration is about $10^{11}/cm^3 \sim 10^{16}/cm^3$. Thus, a highly doped semiconductor layer is formed throughout the depth from a few hundreds of nm to a few μm below the surface of the semiconductor substrate, thereby shortening a response time and filtering the light having the wavelength of the visible and infrared ranges.

According to a detailed fabricating process, the semiconductor substrate having a double or triple structure is fabricated by the expitaxial growth process or the high energetic ion implantation process. Then, the N+ diffusion region 15 is formed at opposite ends of a light entrance window 6 on the semiconductor substrate 14 by an ion implantation method or the like. A dielectric layer 5 is formed on the N+ diffusion region, and then the light entrance window 6 is formed thereon by photolithography and etching processes. Then, a transparent nonconductive material 16 which has an interface charge or a trapped charge is deposited on the dielectric layer 5a. Here, the charge can be artificially trapped in the transparent nonconductive material 16 by the foregoing plasma process or the like. At this time, the surface of the semiconductor may be depleted by the interface charge or the trapped charge, and this depletion region 17 act as light detection area. To form an electrode, a contact is formed by the photolithography and etching processes, and then a metal interconnection line 8 is formed. A metal electrode 9 is formed on the back side of the substrate, thereby completing the fabrication of the photodetector.

As described above, in the photodetector according to the present invention, drifting distance and time of a carrier generated in the depletion region are shortened, thereby shortening the response time. Further, visible light and near infrared light, which are more deeply infiltrated into the surface of the semiconductor than the ultraviolet light, are absorbed in the highly doped P+ (or N+) region or therebelow and creates an electron-hole carrier, but the electron-hole carrier is recombined in highly doped P+ (or N+) region the while drifting. Therefore, the carrier is not detected as an electrical signal, and this results in filtering the light having the wavelength of the visible and near infrared ranges.

(Fourth Embodiment)

Figure 1D:
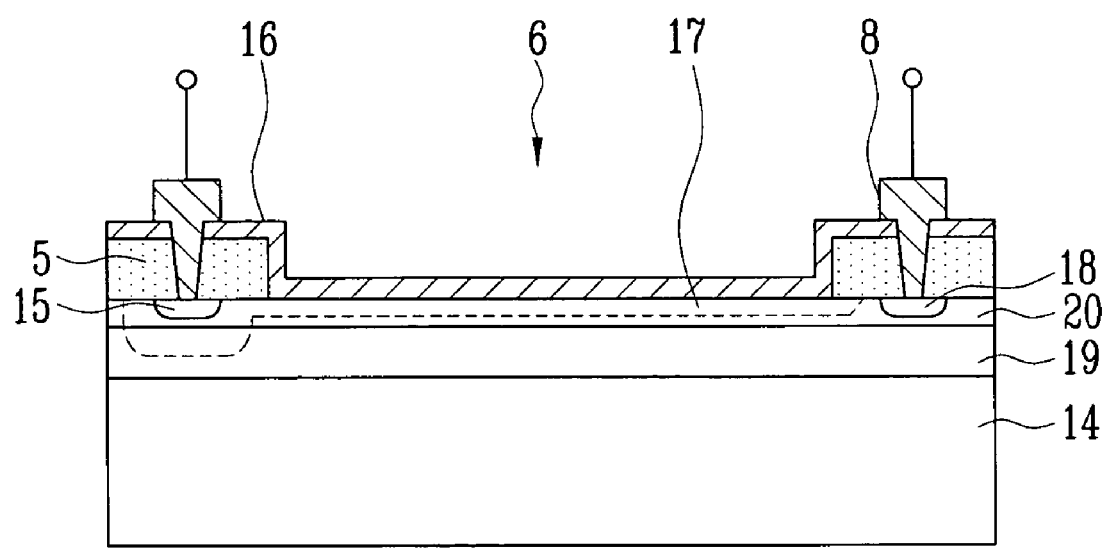
FIG. 1D is a cross sectional view of a photodetector according to a fourth embodiment of the present invention.

Hereinafter, a photodetector according to a fourth embodiment of the present invention will be described with reference to FIG. 1D. FIG. 1D is a cross sectional view of the photodetector according to the fourth embodiment of the present invention. In the following description, a difference between the third and fourth embodiments will be described and repetitive descriptions will be avoided.

In the fourth embodiment, a N+ diffusion region 15 is formed at one end of a depletion region, and a P+ diffusion region 18 is formed at the other end of the depletion region, so that its fabricating process is compatible with a universal semiconductor process, thereby allowing the photodetector according to the present invention to be integrated with other semiconductor devices such as a transistor into one chip. At this time, there is not needed a process of forming a metal interconnection line on a back side of a semiconductor substrate 14.

Figure 2:
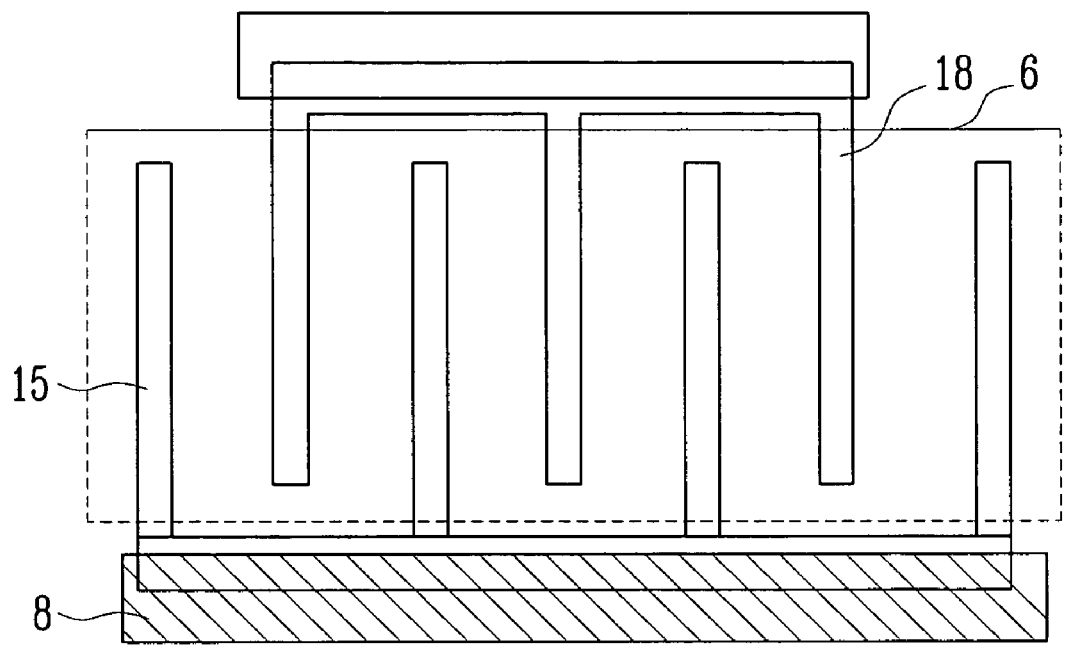
FIG. 2 is a plan view of the photodetector according to the second and fourth embodiments of the present invention.

Hereinafter, a plan structure of the photodetector according to the second and fourth embodiments of the present invention will be described. FIG. 2 is a plan view of the photodetector according to the second and fourth embodiments of the present invention.

Referring to FIG. 2, in the present photodetector, the N+ diffusion region 15 and the P+ diffusion region 18 have a stripe form, respectively, and are interdigitated each other. Preferably, the stripes have an interval of about 5 μm through 1,000 μm therebetween. If the interval between the stripes is wide too much, the response time is delayed.

Oppositely, if the interval between the stripes is narrow too much, light-receiving efficiency is low.

Hereinafter, a fabricating process of the photodetector according to the fourth embodiment of the present invention will be described with reference to FIG. 3, which is compatible with a universal silicon CMOS process.

Figure 3:
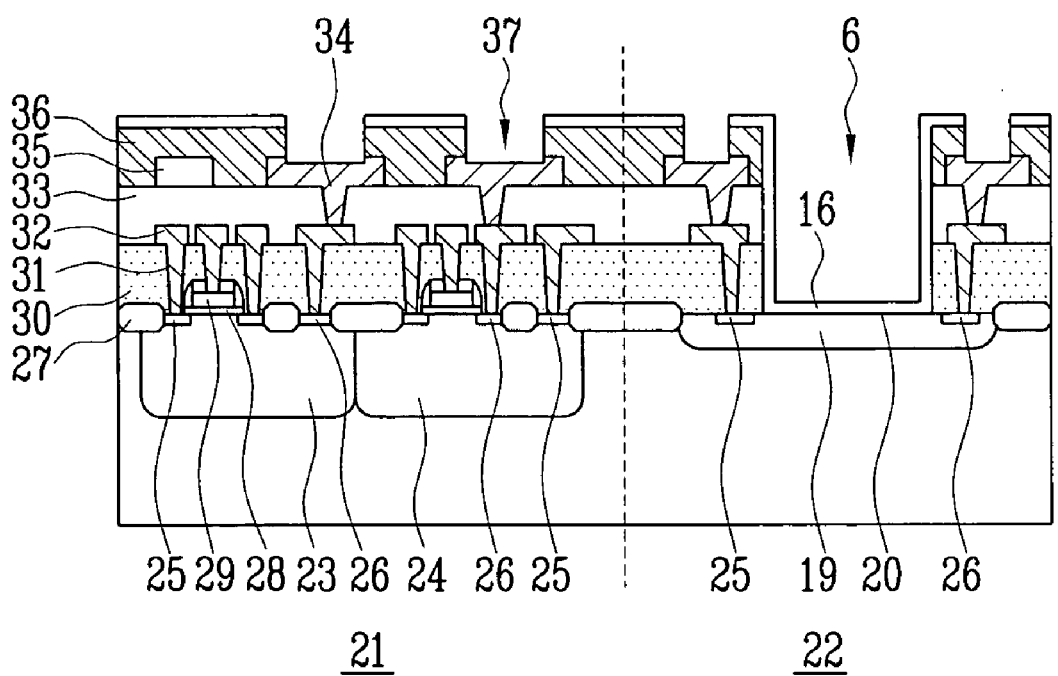
FIG. 3 is a cross sectional view for illustrating the photodetector according to the second and fourth embodiments of the present invention, and an example that a fabricating process may be simultaneously performed using a universal silicon CMOS process.

Referring to FIG. 3, a silicon CMOS region 21 and the optical detecting region 22 are formed separately from each other. In the silicon CMOS region 21, there can be formed of an NMOS and a PMOS. By an isolation layer 27, the silicon CMOS region 21 is isolated from the optical detecting region 22, and the NMOS is isolated from the PMOS. The NMOS is formed in a P-well 23, and comprises an N+ junction region 25, a gate dielectric layer 28, a gate material 29 and further is composed of a spacer, a lightly doped drain (LDD) region, etc., as necessary. The PMOS is formed in an N-well 24, and is composed of a P+ junction region 26, the gate dielectric layer 28, the gate material 29 and further comprises a spacer, a lightly doped drain (LDD) region, etc., as necessary. Meanwhile, in the optical detecting region 22, there are the N+ junction region 25 and the P+ junction region 26, and the highly doped P+ diffusion region 19 (disclosed in the fourth embodiment) may be formed by an ion implantation process, as necessary.

Then, an inter-layer dielectric layer 30, a contact hole 31, a first metal interconnection line 32, an inter-metallic dielectric layer 33, a via hole 34, a second metal interconnection line 35, a passivation layer 36, etc. are formed, and a pad region 37 is exposed. Meanwhile, the optical detecting region 22 is formed of a transparent nonconductive material 16 having a charge on the top thereof.

With this configuration, the silicon CMOS 21 and the photodetector 22 can be easily integrated into one chip by adding a simple fabricating process to the silicon CMOS process, for example, the photolithography and etching processes to open a light entrance window, and a process of depositing the transparent nonconductive layer having the charge.

EXPERIMENTAL EXAMPLE

Figure 4:
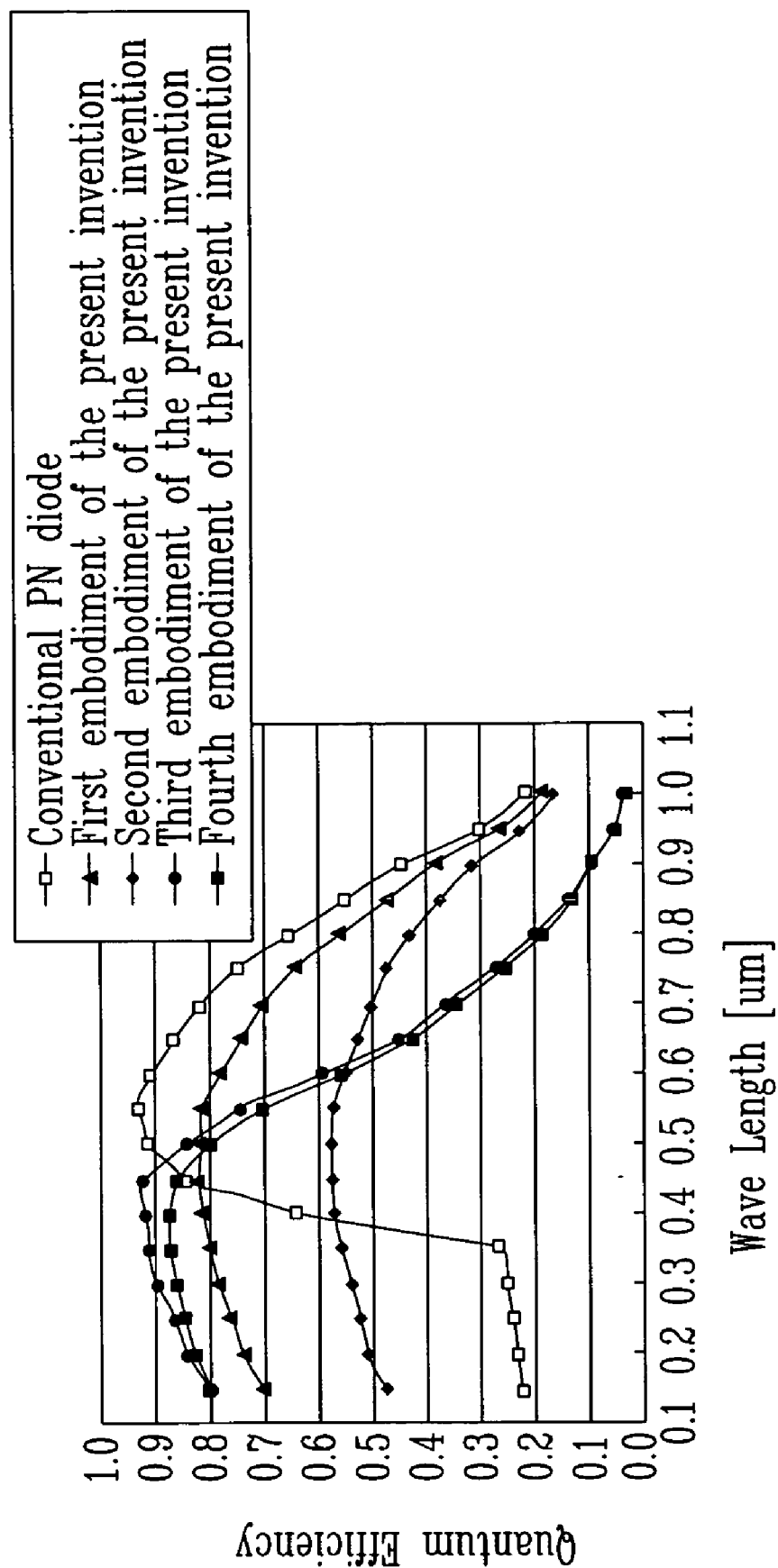
FIG. 4 is a graph based on a TCAD Tool, which illustrates quantum efficiency simulations of a conventional PIN photodetector fabricated using a silicon substrate and the photodetectors according to the foregoing four embodiments.

FIG. 4 is a graph based on a TCAD Tool, which illustrates quantum efficiency simulations of a conventional PIN photodetector fabricated using a silicon substrate and the photodetectors according to the foregoing four embodiments.

Simulation conditions are as follows.

The conventional PN diode: it is a general PN junction diode and employs a depletion region due to P-N junction as a light entrance window. Its substrate is a P-type and has a concentration of $2\times10^{15}/cm^3$; N+ diffusion region has a concentration of $5\times10^{20}/cm^3$; junction depth is 0.4 μm; and depletion region is formed throughout the depth of 0.2~2.2 μm from the silicon surface at an operating voltage of 5V.

The photodetector according to the first embodiment: Its substrate is a P-type and has a concentration of $2\times10^{15}/cm^3$; N+ diffusion region has a concentration of $5\times10^{20}/cm^3$ and is formed at opposite ends of a depletion region; transparent nonconductive layer has a charge of $5\times10^{10}/cm^2$; and depletion region is formed throughout the depth of 0~2.5 μm from the silicon surface at an operating voltage of 5V.

The photodetector according to the second embodiment: Its substrate is a P-type and has a concentration of $2\times10^{15}/cm^3$; N+ and P+ diffusion regions having a concentration of $5\times10^{20}/cm^3$ are formed at opposite ends of a depletion region, respectively; transparent nonconductive layer has a charge of $5\times10^{10}/cm^2$; and depletion region is formed throughout the depth of 0~2.5 μm from the silicon surface at an operating voltage of 5V.

The photodetector according to the third embodiment: Its substrate is a P-type and has a concentration of $2\times10^{15}/cm^3$; highly doped P-type silicon layer having a concentration of $2\times10^{19}/cm^3$ and a thickness of 0.5 μm is formed on the substrate; lightly doped P-type silicon layer having a concentration of $2\times10^{15}/cm^3$ and a thickness of 0.2 μm is formed on the highly doped P-type silicon layer; N+ diffusion region having a concentration of $5\times10^{20}/cm^3$ is formed at opposite ends of a depletion region; transparent nonconductive layer has a charge of $5\times10^{10}/cm^2$; and depletion region is formed throughout the depth of 0~0.1 μm from the silicon surface at an operating voltage of 5V.

The photodetector according to the fourth embodiment: Its substrate is a P-type and has a concentration of $2\times10^{15}/cm^3$; highly doped P-type silicon layer having a concentration of $2\times10^{19}/cm^3$ and a thickness of 0.5 μm is formed on the substrate; lightly doped P-type silicon layer having a concentration of $2\times10^{15}/cm^3$ and a thickness of 0.2 μm is formed on the highly doped P-type silicon layer; N+ and P+ diffusion regions having a concentration of $5\times10^{20}/cm^3$ are formed at opposite ends of a depletion region, respectively; transparent nonconductive layer has a charge of $5\times10^{10}/cm^2$; and depletion region is formed throughout the depth of 0~0.1 μm from the silicon surface at an operating voltage of 5V.

In the result of the simulation, the photodetectors according to the first through fourth embodiments of the present invention are improved in detecting the light of a short wavelength range as compared with the conventional PN diode. Particularly, the photodetectors according to the third and fourth embodiments of the present invention are further improved in detecting the light of a short wavelength range and filtering the light of the visible and near infrared wavelength ranges.

As described above, the present invention provides a photodetector in which a transparent nonconductive material having the charge is deposited on a surface of a semiconductor so as to form a depletion region on the surface of the semiconductor, and the depletion region is employed as an optical detecting region, thereby not only improving detection with respect to light having a wavelength of ultraviolet and blue ranges but also functioning as an anti-reflector.

Further, the present invention provides a photodetector, in which a highly doped semiconductor layer is formed throughout the depth from a few hundreds of nm to a few μm below the surface of the semiconductor, thereby shortening a response time and filtering light having a wavelength of visible and infrared ranges. Further, the present invention provides a photodetector, in which silicon can be used and a fabricating process thereof is compatible with a universal silicon CMOS process.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

This application claims the benefit of Korean Patent Application No. 2003-97048 filed on Dec. 26, 2003, the disclosure of which is hereby incorporated herein by reference in its entirety.

What is claimed is:

1. A photodetector comprising:
   a semiconductor substrate on which a light entrance window is defined for detecting light;
   a transparent nonconductive layer having a charge and formed at the light entrance window on a top of the semiconductor substrate; and
   at least one electrode formed outside of the light entrance window for transferring the charge detected at the light entrance window, wherein the light entrance window has a depletion region on a semiconductor surface thereof depleted by the charge of the transparent nonconductive layer.

2. The photodetector as claimed in claim 1, wherein the charge is an interface charge or a trapped charge depending on inherent properties of material used in the transparent nonconductive layer.

3. The photodetector as claimed in claim 2, wherein the trapped charge is artificially provided.

4. The photodetector as claimed in claim 1, wherein the transparent nonconductive layer is any one of a silicon oxide layer and a silicon nitride layer.

5. The photodetector as claimed in claim 1, wherein the transparent nonconductive layer has a thickness adequate to a wavelength of incident light to function as an anti-reflecting layer.

6. The photodetector as claimed in claim 1, wherein the semiconductor substrate has a laminated structure sequentially formed of a highly doped diffusion region and a lightly doped diffusion region on the surface thereof.

7. The photodetector as claimed in claim 6, wherein the highly and lightly doped diffusion regions are formed by any one of an epitaxial layer and an ion implantation layer.

8. The photodetector as claimed in claim 7, wherein the highly doped diffusion region is formed throughout a depth from a few hundreds of nm to a few μm below the surface of the semiconductor substrate.

9. The photodetector as claimed in claim 1, wherein the at least one electrode is composed of a first electrode of a first highly doped diffusion region formed at one end of the depleted surface of the semiconductor substrate; and a second electrode of a second highly doped diffusion region formed at the other end of the depleted surface of the semiconductor substrate.

10. The photodetector as claimed in claim 9, wherein the first electrode and the second electrode are fabricated in a stripe form, respectively, and are interdigitated each other.

11. The photodetector as claimed in claim 1, wherein the at least one electrode is composed of a first electrode of a first (concentration type opposite to that of the semiconductor substrate) highly doped diffusion region formed at opposite ends of the depleted surface of the semiconductor substrate; and a second electrode of a second (opposite to the first type) highly doped diffusion region formed on a back side of the semiconductor substrate.

12. The photodetector as claimed in claim 11, wherein the first electrode is fabricated in a stripe form.

* * * * *